(12) United States Patent
Yamazaki et al.

(10) Patent No.: US 7,803,651 B2
(45) Date of Patent: Sep. 28, 2010

(54) METHOD OF MANUFACTURING SOLAR CELL MODULE AND METHOD OF MANUFACTURING SOLAR CELL

(75) Inventors: Atsuko Yamazaki, Izumisano (JP); Shinji Kobayashi, Gifu (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 0 days.

(21) Appl. No.: 12/509,242

(22) Filed: Jul. 24, 2009

(65) Prior Publication Data

US 2010/0022047 A1 Jan. 28, 2010

(30) Foreign Application Priority Data

Jul. 25, 2008 (JP) .............................. 2008-192718

(51) Int. Cl.
*H01L 21/00* (2006.01)
(52) U.S. Cl. .............................. 438/67; 438/57; 438/64; 438/80; 257/E21.499
(58) Field of Classification Search ............... 438/57, 438/59, 64, 67, 80; 257/E21.499
See application file for complete search history.

(56) References Cited

U.S. PATENT DOCUMENTS 6,706,961 B2* 3/2004 Shimizu et al. ............. 136/256
2008/0023069 A1 1/2008 Terada et al.

FOREIGN PATENT DOCUMENTS

JP 2008-034592 A 2/2008

* cited by examiner

*Primary Examiner*—Alexander G Ghyka
*Assistant Examiner*—Seahvosh J Nikmanesh
(74) *Attorney, Agent, or Firm*—Marvin A. Motsenbocker; Mots Law, PLLC (57) ABSTRACT

A method of manufacturing the solar cell module 100 according to the embodiment of the present invention includes: a step of forming the plurality of thin line-shaped electrodes and the connecting electrode connected to one end portion of each of the plurality of thin line-shaped electrodes; a step of disposing the first resin layer on the blanket; and a step of transferring the first resin layer onto the blanket by pressing the blanket against the photoelectric conversion part. In the disposing step, the plurality of concave portions is formed in the first resin layer along the outer edge of the connecting electrode. In the transferring step, each concave portion is disposed at one end portion of each thin line-shaped electrode.

3 Claims, 6 Drawing Sheets

METHOD OF MANUFACTURING SOLAR CELL MODULE AND METHOD OF MANUFACTURING SOLAR CELL

CROSS REFERENCE TO RELATED APPLICATIONS

This application is based upon and claims the benefit of priority from prior Japanese Patent Application No. 2008-192718, filed on Jul. 25, 2008; the entire contents of which are incorporated herein by reference.

BACKGROUND OF THE INVENTION

1. Field of the Invention

The present invention relates to a method of manufacturing a solar cell module including a solar cell having a protective film formed therein and a method of manufacturing the solar cell.

2. Description of the Related Art

A Solar cell directly converts clean and unlimitedly supplied sunlight into electricity. Thus, the solar cell is expected as a new energy source.

Generally, the output of a single solar cell is about several watts. For this reason, in order to use such a solar cell as a power source for a house, a building, or the like, a solar cell module in which a plurality of solar cells are connected to each other to increase the output is used. The plurality of solar cells is electrically connected to each other by wiring members. Each of the plurality of solar cells includes: a photoelectric conversion part configured to generate photogenerated carriers; a plurality of thin line-shaped electrodes configured to collect carriers; and a connecting electrode to which the wiring member is connected. The plurality of thin line-shaped electrodes and the connecting electrode are formed on the photoelectric conversion part.

In order to improve the weather resistance as well as the scratch and mar resistance of the solar cell, it is known that a resin layer is formed on the photoelectric conversion part so as to cover the plurality of thin line-shaped electrodes (for example, see Japanese Patent Application Publication No. 2008-34592). Such a resin layer is formed in a way that a resin material is applied onto the photoelectric conversion part by using, for example, an offset printing method. Specifically, a blanket provided with the resin material is pressed against the photoelectric conversion part so as to transfer the resin material onto the photoelectric conversion part. The blanket is formed in the shape of a cylinder, and a cylindrical surface of the blanket is made of an elastic member such as a silicon rubber.

Here, a cylindrical surface of the blanket is pressed against the plurality of thin line-shaped electrodes formed on the photoelectric conversion part, and thus groove-like depressions corresponding to the plurality of thin line-shaped electrodes are formed in the cylindrical surface of the blanket. For this reason, when the blanket is pressed against the photoelectric conversion part, an extra resin material having entered the groove-like depression is extruded by each of the plurality of thin line-shaped electrodes, and thereby applied onto the connecting electrode. As a result, there has been a problem that adhesiveness between the connecting electrode and the wiring member is reduced.

To deal with such a problem, it is conceivable that the resin layer may be formed to be sufficiently spaced apart from the connecting electrode. In this case, however, the weather resistance and the scratch and mar resistance of the solar cell is reduced.

SUMMARY OF THE INVENTION

The present invention has been made in view of the above problem, and has an object to provide a method of manufacturing a solar cell module and a method of manufacturing a solar cell, in which a reduction in adhesiveness between the connecting electrode and the wiring member can be suppressed by accurately forming a resin layer onto a photoelectric conversion part.

A method of manufacturing a solar cell module according to the present invention is a method of manufacturing a solar cell module including first and second solar cells and a wiring member configured to connect the first and second solar cells to one another. The method includes: a step A of forming a plurality of thin line-shaped electrodes and a connecting electrode on a photoelectric conversion part of each of the first and second solar cells, the connecting electrode being to be connected to one end portion of each of the plurality of thin line-shaped electrodes; a step B of disposing a transparent resin layer on a blanket of a printing press; a step C of transferring the resin layer onto the photoelectric conversion part of each of the first and second solar cells by pressing the blanket against the photoelectric conversion part; and a step D of connecting the wiring member to the connecting electrode of each of the first and second solar cells. In the step B, a plurality of concave portions are formed in the resin layer along an outer edge of the connecting electrode; and in the step C, each of the plurality of concave portions is disposed at the one end portion of each of the plurality of thin line-shaped electrodes.

In the method of manufacturing a solar cell module according to the aspect of the present invention, each concave portion overlaps a part, connected to the connecting electrode, of each thin line-shaped electrodes. For this reason, when the blanket is pressed against the photoelectric conversion part, an extra resin material having entered a groove-like depression formed correspondingly to each thin line-shaped electrode in the cylindrical surface of the blanket is led to the concave portions. Accordingly, it is possible to suppress a reduction in adhesiveness between the connecting electrode and the wiring member caused by the resin material applied to the connecting electrode.

In the method of manufacturing a solar cell module according to the aspect of the present invention, in the step C, the resin layer is transferred onto the photoelectric conversion part sequentially from the other end portion of each of the plurality of thin line-shaped electrodes to the one end portion thereof.

A method of manufacturing a solar cell according to an aspect of the present invention is a method of manufacturing a solar cell to which a wiring member is electrically connected. The method includes: a step A of forming a plurality of thin line-shaped electrodes and a connecting electrode on the photoelectric conversion part, the connecting electrode being to be connected to one end portion of each of the plurality of thin line-shaped electrodes; a step B of disposing a transparent resin layer on a blanket of a printing press; and a step C of transferring the resin layer onto the photoelectric conversion part by pressing the blanket against the photoelectric conversion part. In the step B, a plurality of concave portions is formed in the resin layer along an outer edge of the connecting electrode; and in the step C, each of the plurality of concave portions is disposed at the one end portion of each of the plurality of thin line-shaped electrodes.

According to the present invention, it is possible to provide a method of manufacturing a solar cell module and a method of manufacturing a solar cell, in which a reduction in adhesiveness between a connecting electrode and a wiring member can be suppressed by accurately forming a resin layer on a photoelectric conversion part.

DESCRIPTION OF THE PREFERRED EMBODIMENTS

Hereinafter, an embodiment of the present invention will be described with reference to the drawings. Throughout the drawings, the same or similar portions will be denoted by the same or similar reference symbols. However, it should be noted that the drawings are schematic and that proportions and the like of dimensions are different from actual ones. Thus, specific dimensions and the like should be determined based on the description below. Naturally, there are portions where relations or proportions of dimensions are different between the drawings.

(Configuration of Solar Cell Module)

Figure 1:
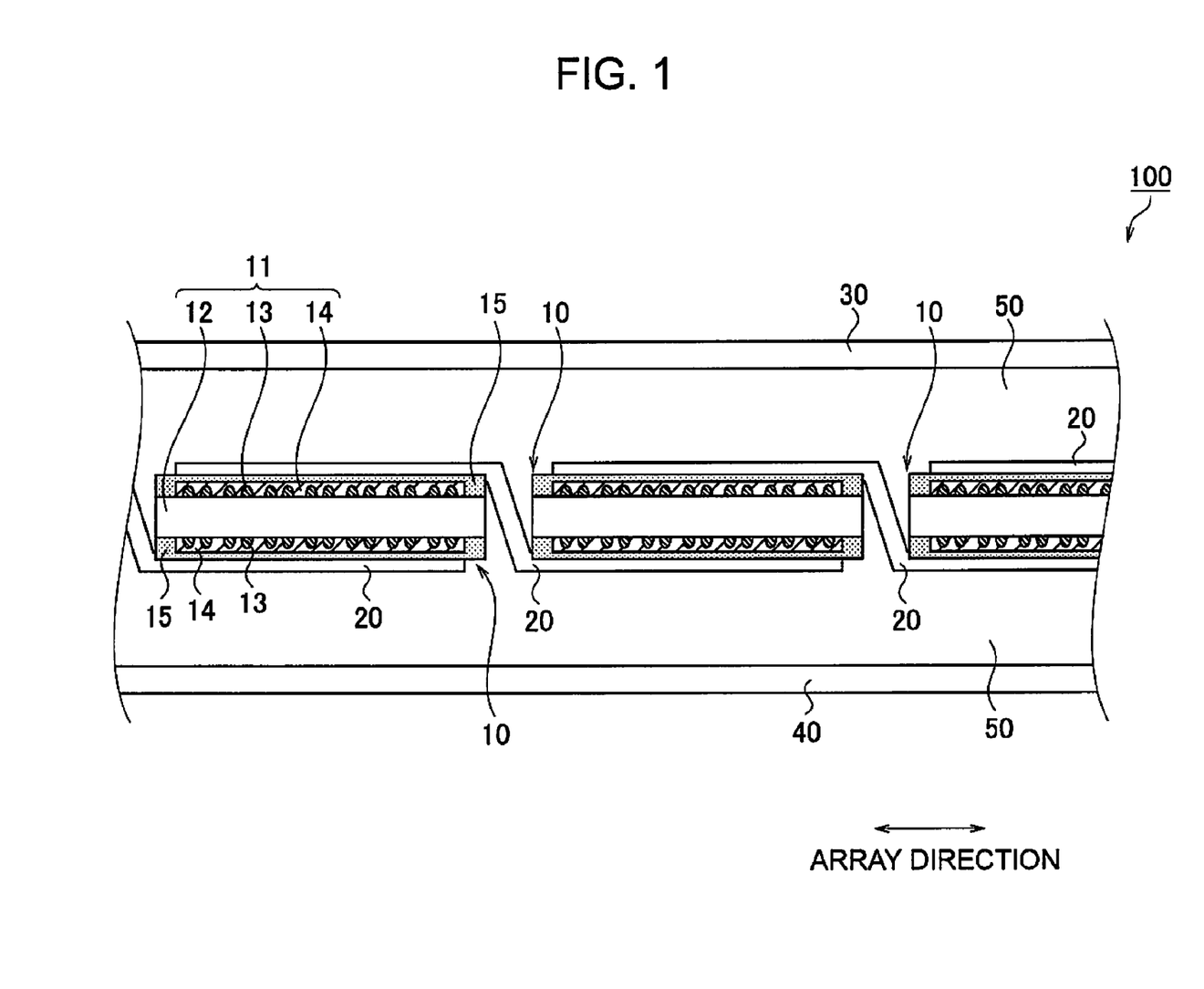
FIG. 1 is a side view of a solar cell module 100 according to an embodiment of the present invention.

Hereinafter, a configuration of a solar cell module according to an embodiment of the present invention will be described with reference to FIG. 1. FIG. 1 is a side view of a solar cell module 100 according to the embodiment of the present invention.

As shown in FIG. 1, the solar cell module 100 includes a plurality of solar cells 10, wiring members 20, a light-receiving-surface side protection member 30, a back surface side protection member 40, and a sealing member 50.

Each of the plurality of solar cells 10 includes a solar cell substrate 11 and a resin layer 15. The solar cell substrate 11 includes a photoelectric conversion part 12, a plurality of thin line-shaped electrodes 13, and connecting electrode 14. The photoelectric conversion part 12 has a light-receiving-surface on which sunlight is incident, and a back surface on the opposite side of the light-receiving-surface. Each of the light-receiving-surface and the back surface is a principal surface of the photoelectric conversion part 12. The plurality of thin line-shaped electrodes 13 and the connecting electrode 14 are formed on each of the light-receiving-surface and the back surface of the photoelectric conversion part 12. The configuration of each of the plurality of solar cells 10 will be described later in detail.

The wiring members 20 are electrically connected to the plurality of solar cells 10 arrayed in the array direction. Specifically, one wiring member 20 is connected to the connecting electrode 14 formed on the light-receiving-surface of the photoelectric conversion part 12 included in one of the plurality of solar cells 10, as well as to the connecting electrode 14 formed on the back surface of the photoelectric conversion part 12 included in another adjacent one of the plurality of solar cells 10. Thus, the plurality of solar cells 10 is electrically connected to one another.

A conductive member such as copper formed in the shape of a thin plate or a twisted line can be used as the wiring member 20. It should be noted that the thin plate-shaped copper or the like used as the wiring member 20 may be covered by a conductive material such as a solder.

The light-receiving-surface side protection member 30 is disposed on a light-receiving-surface side of the sealing member 50 so as to protect a light-receiving-surface of the solar cell module 100. A transparent and water-shielding glass, a transparent plastic, or the like can be used as the light-receiving-surface side protection member 30.

The back surface side protection member 40 is disposed on a back-surface side of the sealing member 50 so as to protect a back surface of the solar cell module 100. A resin film such as a polyethylene terephthalate (PET) film, a laminated film having a structure in which a metal foil such as an Al foil is sandwiched between the resin films, or the like can be used as the back surface side protection member 40.

The sealing member 50 seals the plurality of solar cells 10, which are electrically connected to one another by the wiring members 20, between the light-receiving-surface side protection member 30 and the back surface side protection member 40. A transparent resin, such as EVA, EEA, PVB, silicon, urethane, acryl, or epoxy, can be used as the sealing member 50.

It should be noted that an Al frame can be attached to the outer periphery of the solar cell module 100 having the above-described configuration.

(Configuration of Solar Cell)

Figure 2:
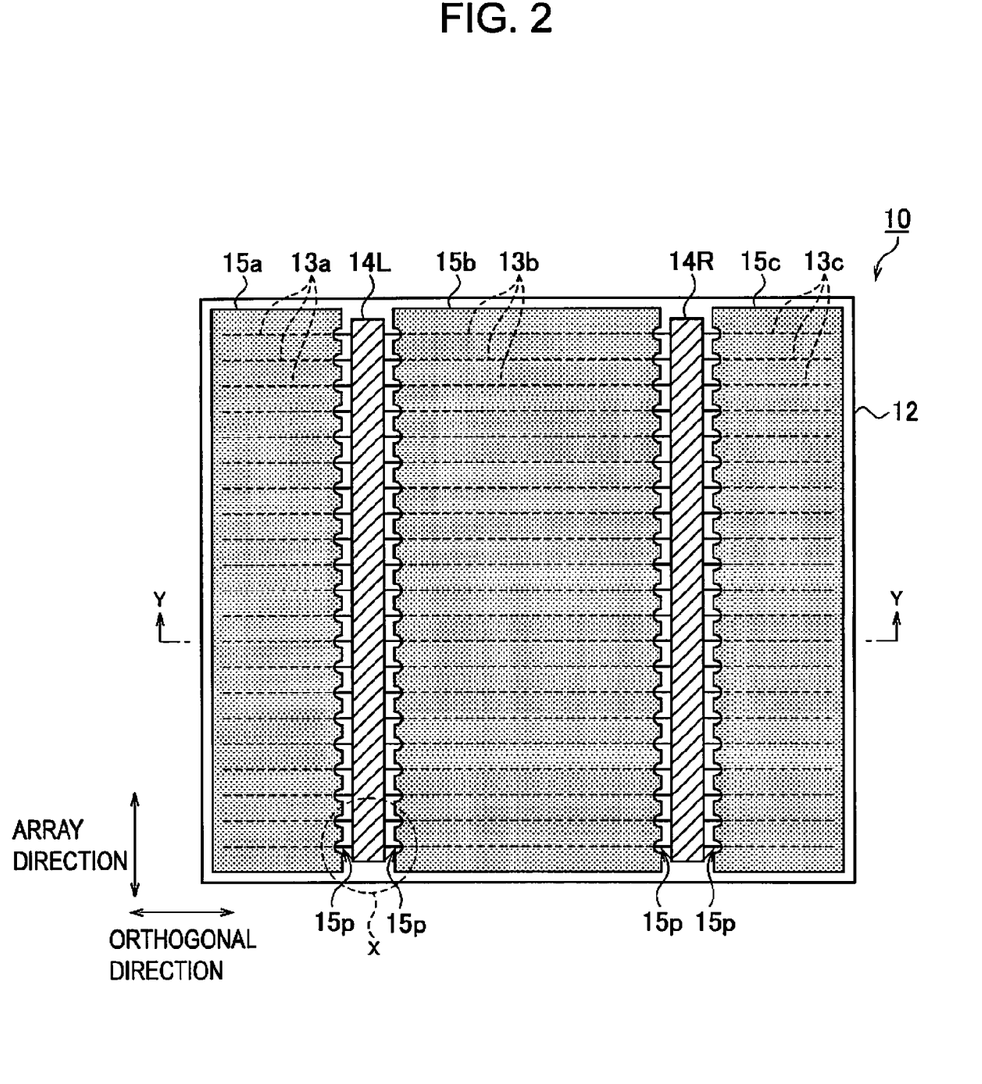
FIG. 2 is a plan view of a light-receiving-surface side of a solar cell 10 according to the embodiment of the present invention.

Hereinafter, the configuration of a solar cell according to the present invention will be described with reference to FIG. 2. FIG. 2 is a plan view of a light-receiving-surface side of the solar cell 10 according to the embodiment of the present invention.

As shown in FIG. 2, the solar cell 10 includes the photoelectric conversion part 12, the plurality of thin line-shaped electrodes 13, two connecting electrodes 14, and the resin layer 15.

The photoelectric conversion part 12 generates photogenerated carriers by receiving sunlight on its light-receiving-surface. The photogenerated carriers are holes and electrons generated when sunlight is absorbed by the photoelectric conversion part 12. The photoelectric conversion part 12 has an n-type region and a p-type region inside thereof, and a semiconductor junction is formed at an interface between the n-type region and the p-type region. The photoelectric conversion part 12 can be formed by use of a semiconductor substrate made of a semiconductor material which is, for example, a crystalline semiconductor material, such as single crystal Si or polycrystal Si, or a compound semiconductor material such as GaAs or InP. Note that, the photoelectric conversion part 12 may have a so-called heterojunction with intrinsic thin layer (HIT) structure. In the HIT structure, a substantially intrinsic amorphous silicon layer is interposed between a single crystal silicon substrate and an amorphous silicon layer. Thereby, defects at the interface are reduced, improving characteristics of a heterojunction at the interface.

The plurality of thin line-shaped electrodes 13 is electrodes configured to collect carriers from the photoelectric conversion part 12. As shown in FIG. 2, the plurality of thin line-shaped electrodes 13 are formed across the substantially entire region of the light-receiving-surface of the photoelectric conversion part 12. The plurality of thin line-shaped electrodes 13 can be formed by using a resin-type conductive paste obtained by employing a resin material as a binder and conductive particles, such as silver particles, as a filler, or by using a sintering-type conductive paste (so-called ceramic paste).

Here in this embodiment, each of the plurality of thin line-shaped electrodes 13 is configured of a plurality of thin line-shaped electrodes 13a, a plurality of thin line-shaped electrodes 13b, and a plurality of thin line-shaped electrodes 13c, respectively.

Each of the plurality of thin line-shaped electrodes 13a is formed in a line shape in the orthogonal direction. As shown in FIG. 2, one end portion of each thin line-shaped electrode 13a is connected to a connecting electrode 14L.

Moreover, each thin line-shaped electrode 13b is formed in a line shape in the orthogonal direction. One end portion of each thin line-shaped electrode 13b is connected to the connecting electrode 14L, while the other end portion of thereof is connected to a connecting electrode 14R.

Furthermore, each thin line-shaped electrode 13c is formed in a line shape in the orthogonal direction. One end portion of each thin line-shaped electrode 13c is connected to the connecting electrode 14R. In this embodiment, one set of the plurality of thin line-shaped electrodes 13a, 13b, and 13c is disposed in a straight line in the orthogonal direction.

It should be noted that the dimensions, shape and number of the plurality of thin line-shaped electrodes 13 can be determined appropriately in consideration of the size, characteristics and the like of the photoelectric conversion part 12. For example, if the photoelectric conversion part 12 has the dimensions of approximately 100 mm per side, approximately 50 thin line-shaped electrodes 13 can be formed.

The two connecting electrodes 14 are electrodes to which the wiring member 20 is connected. As shown in FIG. 2, the two connecting electrodes 14 are formed in the array direction. The two connecting electrodes 14 can be formed by using a similar material to the plurality of thin line-shaped electrodes 13.

Here in this embodiment, the two connecting electrodes 14 are configured of the connecting electrode 14L and the connecting electrode 14R. As described above, one end portion of each of the plurality of thin line-shaped electrodes 13a and one end portion of each of the plurality of thin line-shaped electrodes 13b are connected to the connecting electrode 14L. In addition, the other end portion of the thin line-shaped electrode 13b and one end portion of each of the plurality of thin line-shaped electrodes 13c are connected to the connecting electrode 14R. It should be noted that the dimensions, shape and number of the connecting electrode 14 can be determined appropriately in consideration of the size, characteristics and the like of the photoelectric conversion part 12.

The resin layer 15 is a thin film protecting the photoelectric conversion part 12. Specifically, the resin layer 15 is formed on the light-receiving-surface and the back surface of the photoelectric conversion part 12 in such a manner as to cover the plurality of thin line-shaped electrodes 13. The resin layer 15 improves the weather resistance as well as the scratch and mar resistance of the photoelectric conversion part 12 and the plurality of thin line-shaped electrodes 13. In particular, the resin layer 15 prevents the pn semiconductor junction inside the photoelectric conversion part 12 from being deteriorated due to ionization of the photoelectric conversion part 12 by moisture in the atmosphere. Thus, the resin layer 15 has a function to suppress the deterioration of photoelectric conversion efficiency of the photoelectric conversion part 12.

A transparent resin, such as EVA, PVA, PVB, silicon, acryl, epoxy, and polysilazane, can be used as the resin layer 15. In addition, additives such as silicon oxide, aluminum oxide, magnesium oxide, titanium oxide, and zinc oxide may be added to any of these resins.

In this embodiment, the resin layer 15 is configured of a first resin layer 15a, a second resin layer 15b, and a third resin layer 15c, as shown in FIG. 2.

The first resin layer 15a is formed covering the plurality of thin line-shaped electrodes 13a. Here in a plan view of the first resin layer 15a, a plurality of concave portions 15p of the first resin layer 15a is formed in an end portion of the first resin layer 15a along an outer edge of the connecting electrode 14L. The plurality of concave portions 15p is formed with predetermined intervals in the array direction. One end portion of each thin line-shaped electrode 13a is exposed at a corresponding one of the concave portions 15p. In other words, the first resin layer 15a covers each thin line-shaped electrode 13a except for a part connected to the connecting electrode 14L.

The second resin layer 15b is formed covering the plurality of thin line-shaped electrodes 13b. In a plan view of the second resin layer 15b, a plurality of concave portions 15p of the second resin layer 15b is formed in one end portion of the second resin layer 15b along the outer edge of the connecting electrode 14L. One end portion of each thin line-shaped electrode 13b is exposed at each concave portion 15p. Similarly, a plurality of concave portions 15p of the second resin layer 15b is formed in other end portion of the second resin layer 15b along the outer edge of the connecting electrode 14R. The other end portion of each thin line-shaped electrode 13b is exposed at each concave portion 15p. In other words, the resin layer 15b does not cover both end parts of each thin line-shaped electrode 13b.

The third resin layer 15c is formed covering the plurality of thin line-shaped electrodes 13c. In a plan view of the third resin layer 15c, a plurality of concave portions 15p of the third resin layer 15c is formed in an end portion of the third resin layer 15c along the outer edge of the connecting electrode 14R. The plurality of concave portions 15p is formed with predetermined intervals in the array direction. One end portion of each thin line-shaped electrode 13c is exposed at each concave portion 15p. In other words, the third resin layer 15c covers each thin line-shaped electrode 13c except for a part connected to the connecting electrode 14R.

(Shape of Resin Layer)

Figure 3:
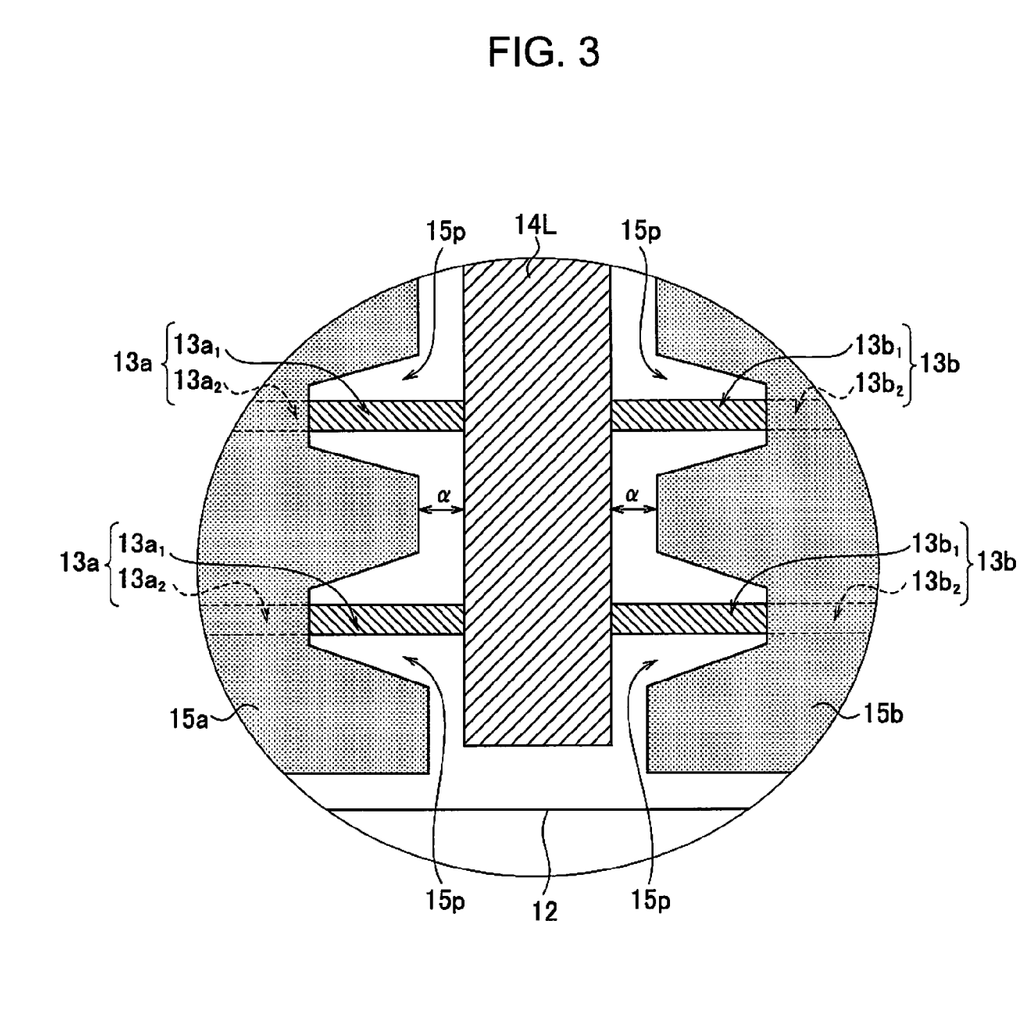
FIG. 3 is an enlarged view of a part indicated by the broken line X in FIG. 2.
Figure 4:
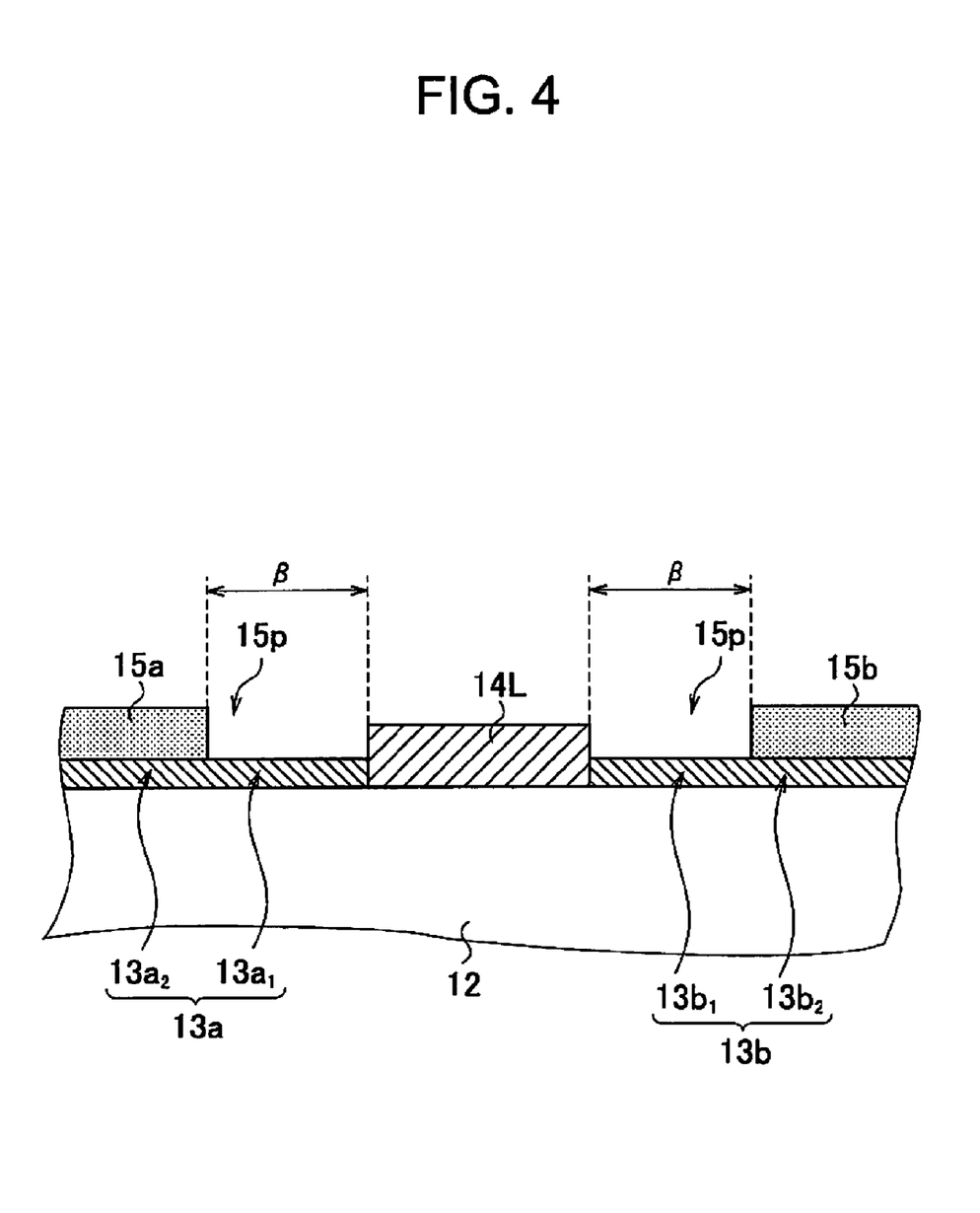
FIG. 4 is an enlarged sectional view taken along the line Y-Y in FIG. 2.

Next, the detailed shape of the resin layer 15 will be described with reference to the drawings. FIG. 3 is an enlarged view of a part indicated by the broken line X in FIG. 2. FIG. 4 is an enlarged sectional view taken along the line Y-Y in FIG. 2.

As shown in FIGS. 3 and 4, each of the plurality of concave portions 15p of the first resin layer 15a is disposed at each of the plurality of thin line-shaped electrodes 13a. Accordingly, the thin line-shaped electrode 13a includes an exposed portion $13a_1$ exposed on the light-receiving-surface of the photoelectric conversion part 12, and a covered portion $13a_2$ covered with the first resin layer 15a. The exposed portion $13a_1$ corresponds to one end portion, connected to the connecting electrode 14L, of the thin line-shaped electrode 13a.

Similarly, each of the plurality of concave portions 15p of the second resin layer 15b is disposed at each of the plurality of thin line-shaped electrode 13b. Accordingly, the thin line-shaped electrode 13b includes an exposed portion $13b_1$ exposed on the light-receiving-surface of the photoelectric conversion part 12, and a covered portion $13b_2$ covered with the first resin layer 15b. The exposed portion $13b_1$ corresponds to one end portion, connected to the connecting electrode 14L, of the thin line-shaped electrode 13b.

In addition, the resin layer 15 is disposed spaced apart from the connecting electrode 14. As shown in FIG. 3, a space α is provided between the resin layer 15 and the connecting electrode 14. In addition, as shown in FIG. 4, a space β is provided between the deepest part of the concave portion 15p of the resin layer 15 and the connecting electrode 14. The spaces α and β are determined in consideration of the viscosity, thickness, and the like of the resin material constituting the resin layer 15. Additionally, the concave portion 15p is provided correspondingly to the thin line-shaped electrode 13. For this reason, the dimensions, shape and the like of the concave portion 15p are appropriately determined in accordance with the dimensions, shape, space and the like of the thin line-shaped electrode 13.

(Method of Manufacturing Solar Cell Module)

Next, a method of manufacturing a solar cell module according to the embodiment of the present invention will be described.

Firstly, the photoelectric conversion part 12 is formed. Then, the plurality of thin line-shaped electrodes 13 is formed, in a first direction, on the light-receiving-surface of the photoelectric conversion part 12. At the same time, the connecting electrodes 14L and 14R are formed in a second direction substantially orthogonal to the first direction. Similarly, the plurality of thin line-shaped electrodes 13 and the connecting electrodes 14L and 14R are formed also on the back surface of the photoelectric conversion part 12. Thus, the solar cell substrate 11 is formed.

Subsequently, the resin layer 15 made of a transparent resin is formed on the light-receiving-surface of the photoelectric conversion part 12. As a method of forming the resin layer 15, the following method (for example, offset printing method, roll coating method or the like) can be used. Specifically, a liquid-like or gel-like transparent resin, disposed on a curved surface of a roller, is transferred onto the light-receiving-surface of the photoelectric conversion part 12 by pressing the roller with the transparent resin layer against the light-receiving-surface of the photoelectric conversion part 12 with the roller being rolled.

Figure 5:
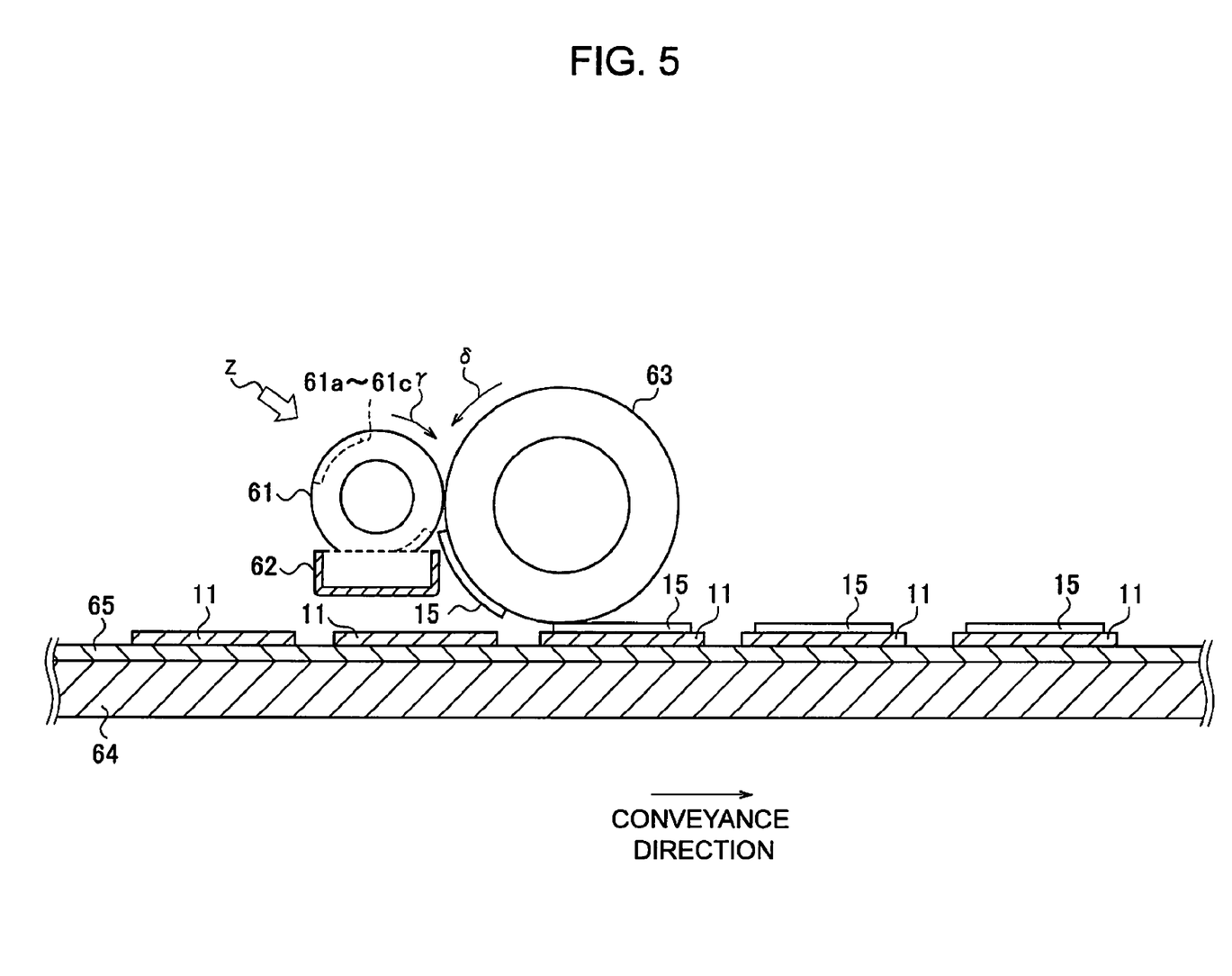
FIG. 5 is a schematic diagram of an offset printing press that is used to form a resin layer 15 according to the embodiment of the present invention.

A method of forming the resin layer 15 will be described more specifically with reference to the drawings. FIG. 5 is a schematic diagram of an offset printing press that is used to form the resin layer 15 according to the embodiment of the present invention. The offset printing press includes a plate cylinder 61, a resin bath 62, a blanket 63, a conveying device 64, and a mounting board 65.

Figure 6:
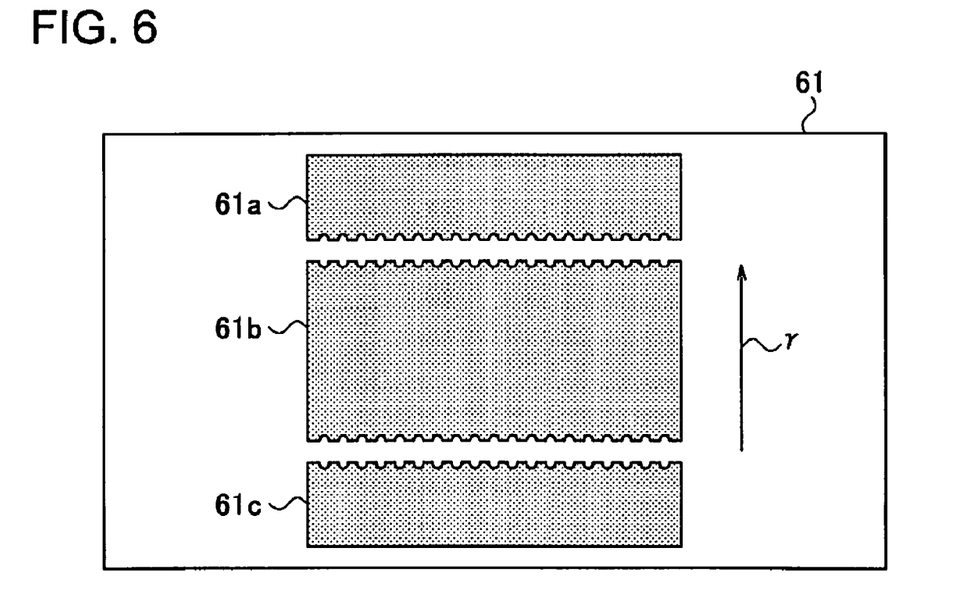
FIG. 6 is a diagram showing intaglio portions 61a to 61c that are formed on a cylindrical surface of a printing cylinder according to the embodiment of the present invention.

The plate cylinder 61 is formed into cylindrical shape and rotates in a rotational direction γ. As shown in FIG. 6, intaglio portions 61a to 61c each having a specific pattern are formed on a cylindrical surface of the plate cylinder 61. Here, the specific pattern is a shape corresponding to the shape of the resin layer 15 disposed on the light-receiving-surface of the photoelectric conversion part 12 (see FIG. 2). Accordingly, in the plan view, the intaglio portion 61a is provided with a plurality of concave portions at a part facing the intaglio portion 61b. Moreover, in the plan view, the intaglio portion 61b is provided with a plurality of concave portions at both a part facing the intaglio portion 61a and a part facing the intaglio portion 61c, respectively. Furthermore, in the plan view, the intaglio portion 61c is provided with a plurality of concave portions at a part facing the intaglio portion 61b side.

The resin bath 62 stores a liquid-like or gel-like transparent resin. The rotating plate cylinder 61 is dipped into the liquid-like or gel-like transparent resin stored in the resin bath 62. The transparent resin adhered to regions other than the intaglio portions 61a to 61c is removed from the cylindrical surface of the plate cylinder 61, and thus the resin remains in the intaglio portions 61a to 61c, as shown in FIG. 6.

The blanket 63 is formed into cylindrical shape and rotates in a rotational direction δ. A cylindrical surface of the blanket 63 is made of an elastic material such as a silicon rubber. The resin remaining in the intaglio portions 61a to 61c of the plate cylinder 61 is transferred onto the cylindrical surface of the blanket 63 by bringing the cylindrical surface of the blanket 63 into contact with the cylindrical surface of the plate cylinder 61. Thus, the resin layer 15 is disposed on the cylindrical surface of the blanket 63. The planar shape of the resin layer 15 disposed on the cylindrical surface of the blanket 63 is the above-mentioned specific pattern. Specifically, as shown in FIG. 7, the resin layer 15 has a pattern in which the plurality of concave portions 15p is formed in the resin layer 15 along the outer edges of the two connecting electrodes 14.

The conveying device 64 (for example, conveyer belt or the like) conveys the solar cell substrate 11 mounted on the flat plate-shaped mounting board 65 in a predetermined conveyance direction. The conveying device 64 conveys the solar cell substrate 11 in the orthogonal direction (see FIG. 2), while causing the solar cell substrate 11 to pass under the blanket 63 rotating in the rotational direction δ. The resin layer 15, which has been transferred onto the cylindrical surface of the blanket 63, is disposed on the light-receiving-surface of the solar cell substrate 11 by pressing the blanket 63 against the solar cell substrate 11.

Figure 7:
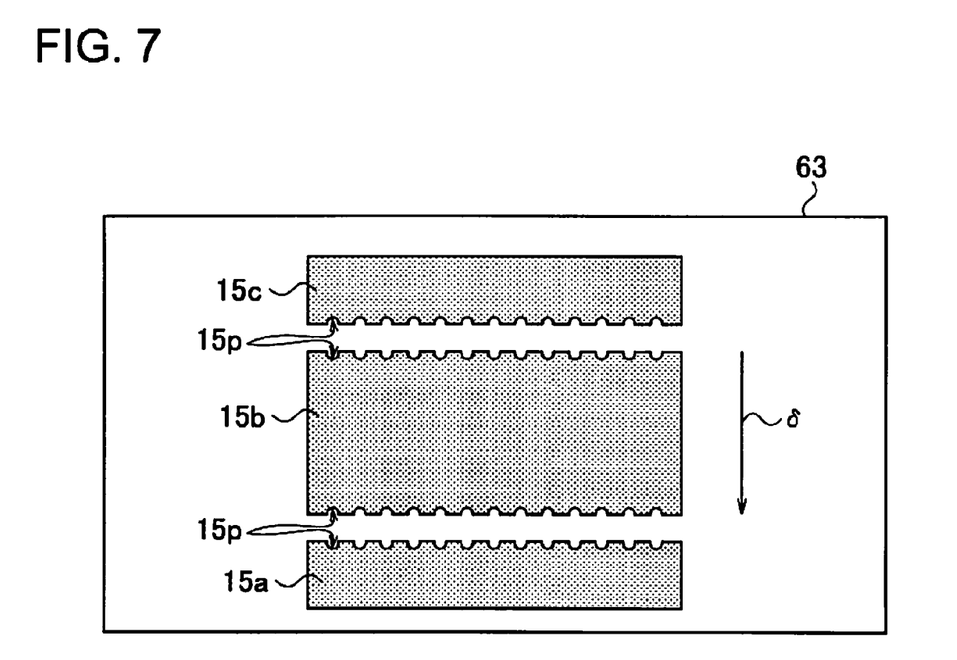
FIG. 7 is a diagram showing the resin layer 15 disposed on a cylindrical surface of a blanket 63 according to the embodiment of the present invention.

Specifically, the resin layer 15 moves in the rotational direction δ while the solar cell substrate 11 moves in the orthogonal direction, as shown in FIG. 7. Accordingly, the first resin layer 15a is sequentially transferred onto the light-receiving-surface of the photoelectric conversion part 12, from its end side to the connecting electrode 14L. In other words, the first resin layer 15a is sequentially transferred onto the light-receiving-surface, toward one end portion, connected to the connecting electrode 14L, of each thin line-shaped electrode 13a. In addition, the second resin layer 15b is sequentially transferred to the light-receiving-surface, toward one end portion, connected to the connecting electrode 14R, of each thin line-shaped electrode 13b. It should be noted here that each concave portion 15p of the first resin layer 15a is disposed above one end portion of each thin line-shaped electrode 13a, and each concave portion 15p of the second resin layer 15b is disposed above one end portion of each thin line-shaped electrode 13b.

Thereafter, the resin layer 15, which has been transferred onto the light-receiving-surface of the solar cell substrate 11, is cured by drying. Thus, the solar cell 10 is produced.

Next, one end portion of one wiring member 20 is connected to the connecting electrode 14 of one solar cell 10, while the other end portion of the wiring member 20 is connected to the connecting electrode 14 of a different solar cell 10. Thus, the one solar cell 10 is electrically connected to the different solar cell 10.

Subsequently, a laminated body is formed by sequentially laminating, on the light-receiving-surface side protection member 30, the sealing member 50, the plurality of solar cells 10 connected to one another by the wiring members 20, the sealing member 50, and the back surface side protection member 40.

After that, the laminated body is subjected to thermocompression bonding in a vacuum atmosphere, and thereby the solar cell module 100 is produced.

(Operations and Effects)

A method of manufacturing the solar cell module 100 according to the embodiment of the present invention includes: a step of forming the plurality of thin line-shaped electrodes 13a and the connecting electrode 14L connected to one end portion of each of the plurality of thin line-shaped electrodes 13a; a step of disposing the first resin layer 15a on the blanket 63; and a step of transferring the first resin layer 15a onto the blanket 63 by pressing the blanket 63 against the photoelectric conversion part 12. In the disposing step, the plurality of concave portions 15p is formed in the first resin layer 15a along the outer edge of the connecting electrode 14L. In the transferring step, each concave portion 15p is disposed at one end portion of each thin line-shaped electrodes 13a.

As described above, each concave portion 15p of the first resin layer 15a overlaps a part, connected to the connecting electrode 14L, of each thin line-shaped electrode 13a. For this reason, when the blanket 63 is pressed against the photoelectric conversion part 12, an extra resin material having entered each groove-like depression formed correspondingly to each thin line-shaped electrode 13a in the cylindrical surface of the blanket 63 is led to each concave portion 15p. Accordingly, it is possible to suppress a reduction in adhesiveness between the connecting electrode 14L and the wiring member 20, because the application of the resin material to the connecting electrode 14L is suppressed.

In addition, in this embodiment, the plurality of concave portions 15p is formed in the second resin layer 15b along the outer edges of the connecting electrodes 14L and 14R. Accordingly, each concave portion 15p of the second resin layer 15b overlaps both end portions of each thin line-shaped electrodes 13b, respectively. Moreover, the plurality of concave portions 15p is formed in the third resin layer 15c along the outer edge of the connecting electrode 14R. Accordingly, each concave portion 15p of the third resin layer 15c overlaps a part, connected to the connecting electrode 14R, of each thin line-shaped electrode 13c.

As described above, a method of manufacturing the solar cell module 100 according to this embodiment is capable of suppressing a reduction in adhesiveness between the connecting electrode 14 and the wiring member 20, because the resin layer 15 is accurately formed on the photoelectric conversion part 12.

Here, the first resin layer 15a is sequentially transferred onto the light-receiving-surface of the photoelectric conversion part 12 from its end side to the connecting electrode 14L. In addition, the second resin layer 15b is sequentially transferred onto the light-receiving-surface, toward one end portion, connected to the connecting electrode 14R, of each thin line-shaped electrode 13b. Accordingly, the resin material is easily squeezed out on the connecting electrode 14, particularly at a part, connected to the connecting electrode 14L, of each thin line-shaped electrode 13a as well as a part, connected to the connecting electrode 14R, of each thin line-shaped electrode 13b. Even in this case, a method of manufacturing the solar cell module 100 according to this embodiment is capable of suppressing application of the resin material to the connecting electrode 14 because the extra resin material can be led to each concave portion 15p.

Other Embodiment

Although the present invention has been described by way of the above embodiment, it should be understood that the description and drawings constituting a part of this disclosure do not limit the present invention. Various alternative embodiments, examples, and operational techniques will become apparent from this disclosure to those skilled in the art.

For example, the resin layer 15 is formed on both the light-receiving-surface and the back surface of the photoelectric conversion part 12 in the above-mentioned embodiment. Alternatively, the resin layer 15 may be formed on only one of the light-receiving-surface and the back surface of the photoelectric conversion part 12. In this case, the resin layer 15 is preferably formed on a surface closer to the pn semiconductor junction formed inside the photoelectric conversion part 12. This is because a reduction in photoelectric conversion efficiency is caused mainly by deterioration of the pn semiconductor junction.

In addition, in the above-mentioned embodiment, the cylindrical blanket 63 is used in the step of forming the resin layer 15 by an offset printing method. The present invention is not limited to this, and the resin layer 15 may also be formed by using a flat plate-shaped blanket, for example.

Moreover, in the above-mentioned embodiment, the resin layer 15 is formed spaced apart from the connecting electrodes 14L and 14R. Alternatively, the resin layer 15 maybe connected to each of the connecting electrodes 14L and 14R. Even in this case, the extra resin material is led to each concave portion 15p.

Further, in the above-mentioned embodiment, the resin layer 15 is formed spaced apart from each of the end sides of the light-receiving-surface of the photoelectric conversion part 12. The present invention is not limited to this, and the resin layer 15 may also be formed to reach each end side.

Furthermore, in the above-mentioned embodiment, the difference in height does not necessarily exist between a region for removing the resin and a region for retaining the resin. Specifically, the region for removing the resin and the region for retaining the resin may be separated chemically.

Besides, in the above-mentioned embodiment, the plurality of thin line-shaped electrodes 13 and the two connecting electrodes 14 are formed on the back surface of the photoelectric conversion part 12. The present invention is not limited to this. Specifically, the electrodes for collecting the photogenerated carriers may be formed covering the entire back surface of the photoelectric conversion part 12. The present invention does not limit a shape of each electrode formed on the back surface of the photoelectric conversion part 12.

Additionally, in the above-mentioned embodiment, the plurality of thin line-shaped electrodes 13 are formed in a line shape, in the orthogonal direction, on the light-receiving-surface of the photoelectric conversion part 12. However, each thin line-shaped electrode 13 is not necessarily formed in a line shape. The present invention does not limit a shape of each thin line-shaped electrode 13.

As described above, it is a matter of course that the present invention incorporates a variety of embodiments and the like, which are not described herein. Thus, the technical scope of the present invention is only defined by the subject matters according to the scope of claims appropriate from the foregoing description.

What is claimed is:

1. A method of manufacturing a solar cell module including first and second solar cells and a wiring member configured to connect the first and second solar cells to one another, the method comprising:
- a step A of forming a plurality of thin line-shaped electrodes and a connecting electrode on a photoelectric conversion part of each of the first and second solar cells, the connecting electrode being to be connected to one end portion of each of the plurality of thin line-shaped electrodes;
- a step B of disposing a transparent resin layer on a blanket of a printing press;
- a step C of transferring the resin layer onto the photoelectric conversion part of each of the first and second solar cells by pressing the blanket against the photoelectric conversion part; and
- a step D of connecting the wiring member to the connecting electrode of each of the first and second solar cells, wherein
- in the step B, a plurality of concave portions are formed in the resin layer along an outer edge of the connecting electrode, and
- in the step C, each of the plurality of concave portions is disposed at the one end portion of each of the plurality of thin line-shaped electrodes.

2. The method of manufacturing a solar cell module according to claim 1, wherein
- in the step C, the resin layer is transferred onto the photoelectric conversion part sequentially from the other end portion of each of the plurality of thin line-shaped electrodes to the one end portion thereof.

3. A method of manufacturing a solar cell which includes a photoelectric conversion part and to which a wiring member is electrically connected, the method comprising:
- a step A of forming a plurality of thin line-shaped electrodes and a connecting electrode on the photoelectric conversion part, the connecting electrode being to be connected to one end portion of each of the plurality of thin line-shaped electrodes;
- a step B of disposing a transparent resin layer on a blanket of a printing press; and
- a step C of transferring the resin layer onto the photoelectric conversion part by pressing the blanket against the photoelectric conversion part, wherein
- in the step B, a plurality of concave portions is formed in the resin layer along an outer edge of the connecting electrode, and
- in the step C, each of the plurality of concave portions is disposed at the one end portion of each of the plurality of thin line-shaped electrodes.

* * * * *